United States Patent
Ishii et al.

(10) Patent No.: US 6,333,103 B1
(45) Date of Patent: Dec. 25, 2001

(54) ALUMINUM OXIDE-COATED ARTICLE

(75) Inventors: Toshio Ishii; Masayuki Gonda, both of Saitama-ken; Hiroshi Ueda, Chiba-ken; Shirou Okayama, Chiba-ken; Nobuhiko Shima, Chiba-ken, all of (JP)

(73) Assignees: Hitachi Metals, Ltd.; Hitachi Tools Engineering, Ltd., both of Tokyo (JP)

( * ) Notice: Subject to any disclaimer, the term of this patent is extended or adjusted under 35 U.S.C. 154(b) by 0 days.

(21) Appl. No.: 09/434,176

(22) Filed: Nov. 5, 1999

(30) Foreign Application Priority Data

Nov. 5, 1998 (JP) ................................................ 10-330203

(51) Int. Cl.$^7$ ....................................................... B32B 9/00
(52) U.S. Cl. .......................... 428/325; 428/336; 428/469; 428/697; 428/698; 428/699; 428/701; 428/702; 51/307; 51/309; 407/119
(58) Field of Search ..................................... 428/701, 702, 428/698, 697, 699, 336, 325, 469; 51/307, 309; 407/119

(56) References Cited

U.S. PATENT DOCUMENTS

| | | | |
|---|---|---|---|
| 3,837,896 | | 9/1974 | Lindstrom et al. . |
| 3,977,061 | * | 8/1976 | Lindstrom et al. .................... 428/212 |
| 5,071,696 | * | 12/1991 | Chatfield et al. ..................... 428/701 |
| 5,137,774 | * | 8/1992 | Ruppi .................................. 428/336 |
| 5,702,808 | | 12/1997 | Ljungberg . |
| 5,766,782 | | 6/1998 | Ljungberg . |
| 5,851,687 | * | 12/1998 | Ljungberg ............................ 428/699 |
| 5,972,495 | * | 10/1999 | Ishii et al. ............................ 428/698 |

FOREIGN PATENT DOCUMENTS

| | | |
|---|---|---|
| 197 52 644 A1 | 6/1998 | (DE) . |
| 5-295517 | 11/1993 | (JP) . |
| 6-316758 | 11/1994 | (JP) . |
| 7-216549 | 8/1995 | (JP) . |
| 10-156606 | 6/1998 | (JP) . |

OTHER PUBLICATIONS

"Crystallographic Orientation and Surface Morphology of Chemical Vapor Deposited $Al_2O_3$" by Park et al. Journal of Electrochemical Society, vol. 130, No. 7, Jul. 1983 pp. 1607–1611.

ASTM File No. 10–173 (Powder Diffraction File Published by JCPDS Intl. Center for Diffraction Data).

"The Effect of Reaction Condition on the Crystallographic Orientation and Surface Morphology of Chemical Vapor Deposited $Al_2O_3$" Proc. $4^{th}$ Eur. Conf. CVD (1983) pp. 410–420 no month.

* cited by examiner

Primary Examiner—Archene Turner
(74) Attorney, Agent, or Firm—Sughrue Mion, PLLC

(57) ABSTRACT

An aluminum oxde-coated article has a first coating layer and a second coating layer formed in this order on a substrate, the first coating layer having a single- or multi-layer structure and being made of at least one selected from the group consisting of carbides, nitrides, carbonitrides, oxides, oxycarbides, oxynitrides and oxycarbonitrides of metals in Groups IVa, Va and VIa of the Periodic Table, and the second coating layer being constituted by at least one α-aluminum oxide-based oxide layer, which has an equivalent X-ray diffraction peak ratio PR (1 0 10) of 1.3 or more in a (1 0 10) plane.

12 Claims, 4 Drawing Sheets

ALUMINUM OXIDE-COATED ARTICLE

FIELD OF THE INVENTION

The present invention relates to an aluminum oxide-coated article suitable for tools, dies and metal melt-contacting members with excellent cutting properties, wear resistance, durability, etc.

DESCRIPTION OF PRIOR ART

Coated tools are generally produced by forming thin, hard layers on surfaces of substrates made of cemented carbides, high-seed steel or specialty steel by a chemical or physical deposition method. The coated tools have both good wear resistance derived from coating layers and good toughness derived from tool substrates, thus being widely used in various applications. Particularly when high-seed steel bodies are cut with tools at high speeds, tip ends or edges of cutting tools are subjected to temperature elevation to about 1000° C., and at such a high temperature the coated tools should be resistant to wear by contact with the high-seed steel bodies or mechanical impact caused by intermittent cutting, etc. Accordingly, coated tools with excellent wear resistance, toughness, impact resistance and durability are highly desired.

Used widely for hard coatings for tools are non-oxide coatings composed of carbides, nitrides or carbonitrides of metals in Groups IVa, Va and VIa of the Periodic Table, and oxidation-resistant oxide coatings, and these coatings may be constituted by a single layer or a plurality of layers. Used for the non-oxide coatings are titanium carbide, titanium nitride, titanium carbonitride, and used for the oxide coatings are particularly κ-aluminum oxide, α-aluminum oxide, etc. Non-oxide coatings made of carbides, nitrides or carbonitrides are poor in oxidation resistance, and to obviate this defect an oxide layer made of aluminum oxide with excellent oxidation resistance is generally formed.

However, a multilayer coating structure consisting of at least one non-oxide layer and at least one oxide layer is disadvantageous in that adhesion is poor between the non-oxide layer and the oxide layer, and that such a multi-layer coating does not exhibit stable mechanical strength at high temperatures.

When κ-aluminum oxide is used for the oxide layer, it exhibits relatively good adhesion to the non-oxide layer and can be coated at relatively low temperatures of 1000–1020° C. to provide layers with relatively small crystal grain sizes. However, because κ-aluminum oxide is a metastable aluminum oxide, it is transformed to α-aluminum oxide at high temperatures, causing volume change. Therefore, when used for cutting tools, etc., the κ-aluminum oxide layer suffers from cracking due to temperature elevation, thus failing to have enough resistance to peeling.

On the other hand, α-aluminum oxide is stable without change in crystal grain sizes at high temperatures, exhibiting excellent high-temperature stability. However, the α-aluminum oxide layer should be formed at higher temperatures than the κ-aluminum oxide layer, resulting in increase in crystal grain sizes, which leads to the unevenness of cutting properties in the α-aluminum oxide-coated tools.

Chul-Soon et al discussed the relations between the crystal orientation of α-aluminum oxide and its crystal structure. See "The Effect of Reaction Condition on the Crystallographic Orientation and Surface Morphology of Chemical Vapor Deposited $Al_2O_3$," Proc. $4^{th}$ Euro. Conf. CVD (1983), pp. 410–420. To evaluate the relations of the crystal orientation of α-aluminum oxide with coating conditions, Chul-Soon et al. defined a texture coefficient TC (hkl) as shown in the equation (1) below as a parameter showing the crystal orientation of α-aluminum oxide, $$TC\ (hkl) = \{I\ (hkl)/I_0(hkl)\}/[\Sigma\{(hkl)/I_0(hkl)\}8] \quad (1),$$

wherein (hkl)=(012), (104), (110), (113), (024), (116), (124) and (030), I (hkl) is the measured intensity of X-ray diffraction from a (hkl) plane of an α-$Al_2O_3$ layer, and $I_0$ (hkl) is the standard intensity of X-ray diffraction described in ASTM file No. 10-173 (Powder Diffraction File Published by JCPDS International Center for Diffraction Data).

TC (hkl) defined by the equation (1) indicates a relative intensity of the X-ray diffraction measured on a (hkl) plane of the α-$Al_2O_3$ layer. The fact that TC (hkl) is large means that an X-ray diffraction peak ratio expressed by I (hkl)/$I_0$ (hkl) is larger than the average of all peaks expressed by $\Sigma\{I$ (hkl) $I_0$(hkl)}/8. Thus, the larger the TC (hkl) is, the higher the X-ray diffraction peak ratio from the (hkl) plane is than the other peak ratios, namely, the more the (hkl) plane is oriented in a tangent direction of the substrate.

Chul-Soon et al. reported that when an α-aluminum oxide layer is formed by using an $AlCl_3$ gas, a $CO_2$ gas and an $H_2$ gas after the formation of a TiN layer on a surface of a cemented carbide substrate, the texture coefficient TC (hkl) from a (012) plane to a (030) plane is substantially as uniform as 0.91–1.13 at a layer-forming temperature of 1000° C., indicating that the crystal is substantially uniformly oriented. They also reported that as the layer-forming temperature is elevated from 1000° C. to 1050° C., to 1100° C. and to 1150° C., the orientation in (104) and (116) planes increases, and that as the ratio of an $AlCl_3$ gas increases, the orientation of the (104) plane is intensified. However, Chul-Soon et al. failed to describe the X-ray diffraction intensity of the (1 0 10) plane at all, suggesting that the measured intensity of X-ray diffraction of the (1 0 10) plane was too small to be discussed. Also, according to the article of Chul-Soon et al., the texture coefficient TC (hkl) and the layer surface structure are separately described, without any reference to their correlations.

With respect to the correlations between the crystal orientation of α-aluminum oxide layers and the cutting properties of tools coated with such α-aluminum oxide layers, Japanese Patent laid-Open No. 5-295517 proposes an alumina-coated cemented carbide body produced by coating a cemented carbide substrate with a TiCN layer and an α-$Al_2O_3$ layer having a texture coefficient TC (104) of more than 1.5 in the same coating process. Also, Japanese Patent Laid-Open No. 6-316758 proposes an alumina-coated body having an alumina layer having a texture coefficient TC (012) of more than 1.3. Further, Japanese Patent Laid-Open No. 7-216549 proposes an aluminacoated body substantially free from cooling cracks, the alumina layer having a texture coefficient TC (110) of more than 1.5. These laid-open Japanese patent applications do not include a (030) plane in the calculation of the texture coefficient TC (hkl) defined by the above equation (1). However, these laid-open Japanese patent applications fail to refer to the X-ray diffraction intensity from a (1 0 10) plane, and it may be presumed from this fact that the X-ray diffraction intensity from a (1 0 10) plane was too weak to discuss, like in the article of Chul-Soon et al.

In view of such circumstances, the inventors previously proposed an aluminum oxide-coated tool having a first coating layer and a second coating layer formed in this order on a tool substrate, the first coating layer having a single- or multi-layer structure and being made of at least one selected from the group consisting of carbides, nitrides, carbonitrides, oxides, oxycarbides, oxynitrides and oxycarbonitrides of metals in Groups IVa, Va and VIa of the Periodic Table, and the second coating layer being constituted by at least one α-aluminum oxide-based oxide layer, the largest peak of equivalent X-ray diffraction being obtained from a (110) plane (Japanese Patent Laid-Open No. 10-156606). This reference does not discuss the X-ray diffraction intensity from the (1 0 10) plane, either, because it is too weak to be analyzed in this α-aluminum oxide-coated tool.

OBJECT AND SUMMARY OF THE INVENTION

Accordingly, an object of the present invention is to provide an article such as a tool coated with aluminum oxide, crystal grains of which are so fine that the equivalent X-ray diffraction peak ratio PR (1 0 10) in a (1 0 10) plane is within an optimum range, thereby having excellent characteristics such as cutting durability, wear resistance, etc.

As a result of research in view of the above object, it has been found that when an α-aluminum oxide layer is formed on a tool substrate via a bonding layer comprising a TiCO layer, etc., using, for instance, a mixed gas of an $AlCl_3$ gas, an $H_2$ gas, and a mixed oxidizing gas consisting of $CO_2$ and CO, the crystal orientation of a (1 0 10) plane, namely an equivalent X-ray diffraction peak ratio PR (1 0 10), is high in the resultant α-aluminum oxide-based oxide layer, and thus crystal grains in the α-aluminum oxide-based oxide layer are so fine, and consequently the resultant aluminum oxide-coated tool has excellent mechanical properties and cutting durability.

Thus, the aluminum oxide-mated article according to the present invention has a first coating layer and a second coating layer formed in this order on a substrate, the first coating layer having a single- or multi-layer structure and being made of at least one selected from the group consisting of carbides, nitrides, carbonitrides, oxides, oxycarbides, oxynitrides and oxycarbonitrides of metals in Groups IVa, Va and VIa of the Periodic Table, and the second coating layer being constituted by at least one α-aluminum oxide-based oxide layer, which has an equivalent X-ray diffraction peak ratio PR (1 0 10) of 1.3 or more in a (1 0 10) plane.

The equivalent X-ray diffraction peak ratio PR (1 0 10) of the α-aluminum oxide-based oxide layer is preferably 1.5 or more in the (1 0 10) plane. Also, the equivalent X-ray diffraction peak ratio PR (1 0 10) is preferably the maximum in the (1 0 10) plane.

In a preferred embodiment of the present invention, the (1 0 10) plane of the α-aluminum oxide-based oxide layer is oriented in a tangent direction of a substrate surface, and the α-aluminum oxide-based oxide layer has a small average crystal grain size relative to a layer thickness. Therefore, cracks do not easily propagate in the α-aluminum oxide-based oxide layer, thereby providing the article with excellent wear resistance, impact resistance and durability.

In a further embodiment of the present invention, an average crystal grain size of the α-aluminum oxide-based oxide layer measured on a surface thereof is preferably 1 μm or less when the oxide layer thickness is 2.5 μm or less; 2 μm or less, more preferably 1.5 μm or less when the oxide layer thickness is more than 2.5 μm and 4.5 μm or less; and 3 μm or less, more preferably 2.5 μm or less when the oxide layer thickness is more than 4.5 μm. With the average crystal grain size within the above preferred range, the aluminum oxide layer surface has such a decreased roughness that its friction coefficient with a body to be cut decreases, and the propagation of cracks in the layer is less likely, thereby providing the tool with excellent wear resistance and cutting durability.

The α-aluminum oxide-based oxide layer may be coated with a titanium compound layer. Also, the tool substrate is preferably made of a cemented carbide composed of at least one selected from the group consisting of carbides, nitrides and carbonitrides of metals in Groups IVa, Va and VIa of the Periodic Table and at least one metal selected from the group consisting of Fe, Ni, Co, W, Mo and Cr. With this tool substrate, the aluminum oxide-coated tool is provided with a well-balanced combination of toughness, hardness and heat resistance, and thus improved cutting durability.

DETAILED DESCRIPTION OF THE PREFERRED EMBODIMENTS

Figure 1:
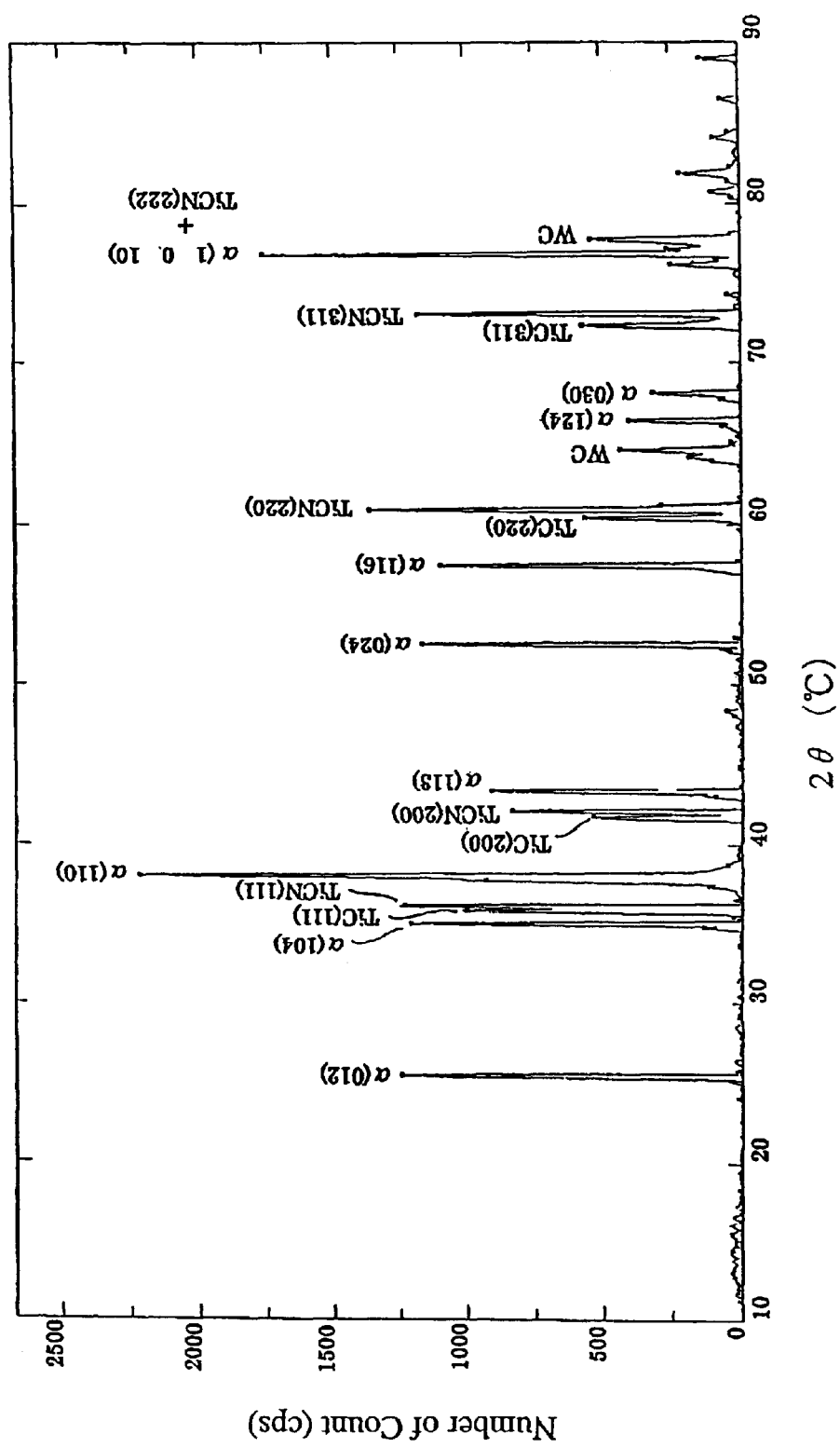
FIG. 1 is a graph showing an X-ray diffraction pattern of an aluminum oxide-coated tool (Sample No. 14) in EXAMPLE 1.

FIG. 1 shows a typical X-ray diffraction pattern of an aluminum oxide-coated tool of the present invention measured by a 2 θ-θ scanning method. An X-ray source used is Kα1 of Cu (wavelength λ=0.154 nm). The aluminum oxide-coated tool measured is produced by coating a cemented carbide substrate with a titanium nitride layer, a titanium carbonitride layer, a titanium carbide layer and a titanium oxycarbide layer in this order, and then with an a α-aluminum oxide layer. The X-ray diffraction intensity of the α-aluminum oxide layer of the present invention at 2θ of around 76.90° is higher than that of α-aluminum oxide in a (1 0 10) plane shown in Table 1 below and the standard X-ray diffraction intensity of TiCN in a (222) plane shown in Table 2 below.

Table 1 shows the interplanar spacing d, 2θ, standard X-ray diffraction intensity $I_0$ of α-aluminum oxide in each crystal orientation. The interplanar spacing d and the standard intensity $I_0$ of X-ray diffraction were obtained from the ASTM file No. 10-173, and the 2θ value was calculated from the value measured by using a Kαl ray of Cu and the interplanar spacing d.

TABLE 1

| Crystal Plane | (012) | (104) | (110) | (113) | (024) | (116) | (124) | (030) | (1010) |
|---|---|---|---|---|---|---|---|---|---|
| d (nm) | 0.348 | 0.255 | 0.238 | 0.209 | 0.174 | 0.160 | 0.140 | 0.137 | 0.124 |
| 2θ (°) | 25.58 | 35.13 | 37.78 | 43.36 | 52.55 | 57.52 | 66.55 | 68.19 | 76.88 |
| $I_0$ | 75 | 90 | 40 | 100 | 45 | 80 | 30 | 50 | 16 |

Table 2 shows the interplanar spacing d and the 2θ value of TiCN, and the data of standard X-ray diffraction intensity $I_0$ of TiC and TiN in each crystal orientation. The interplanar spacing d and the 2θ value of TiCN are measured values. The standard X-ray diffraction intensity $I_0$ of TiC is available from ASTM file No. 29-1361, and that of TiN is available from ASTM file No. 38-1420. It is assumed that the standard X-ray diffraction intensity $I_0$ of TiCN is identical to that of TiC.

TABLE 2

| Crystal Plane | (111) | (200) | (220) | (311) | (222) | (420) | (422) |
|---|---|---|---|---|---|---|---|
| d (nm) | 0.2477 | 0.2144 | 0.1516 | 0.1293 | 0.1238 | 0.0959 | 0.0875 |
| 2θ (°) | 36.24 | 42.10 | 61.06 | 73.14 | 76.96 | 106.94 | 123.28 |
| $I_0$ (TiC) | 80 | 100 | 60 | 30 | 17 | 25 | 25 |
| $I_0$ (TiN) | 72 | 100 | 45 | 19 | 12 | 14 | 12 |

To quantitatively evaluate the orientation of α-$Al_2O_3$ from a (012) plane to a (1 0 10) plane, the above-described equation of TC (hkl) is modified to define an equivalent X-ray diffraction peak ratio PR (hkl) as follows:

$$PR\ (hkl) = \{I\ (hkl)/I_0(hkl)\}/[\Sigma\{I\ (hkl)/I_0(hkl)\}/9] \quad (2)$$

wherein (hkl)=(012), (104), (110), (113), (024), (116), (124), (030) and (1 0 10).

I (hkl) and $I_0$ (hkl) are the same as in the equation (1) of TC (hkl), and the crystal orientations used in the above calculation include a (1 0 10) plane in addition to the planes of (012) to (030).

As is clear from Tables 1 and 2, the difference between the 2θ value (76.96°) of the (222) plane of TiCN and the 2 θvalue (76.880°) of the (1 0 10) plane of α-$Al_2O_3$ is only 0.08°, failing to distinguish these two X-ray diffraction peaks. Thus, using the fact that the (222) plane is structurally identical to a (111) plane in TiCN, the X-ray diffraction intensity of the (222) plane of TiCN was determined from the following equation (3). The calculated value of the X-ray diffraction intensity was subtracted from the X-ray diffraction intensity I (76.9°) measured at around 76.9° to determine the X-ray diffraction intensity of α-$Al_2O_3$ in the (1 0 10) plane.

$$I\ (222)\ of\ TiCN = I(111) \times I_0(222)/I_0(111) = I(111)17/80 \quad (3),$$

$$I\ (1\ 0\ 10)\ of\ \alpha\text{-}Al_2O_3 = I\ (76.9°) - I\ (111)\ of\ TiCN \times 17/80 \quad (4).$$

Used as the standard X-ray diffraction intensity $I_0$ (hkl) of TiCN was the value of TiC. If the standard X-ray diffraction intensity $I_0$ (hkl) of TiN were used, I (222) of TiCN would be I (111)×12/72, larger than the calculated value of the equation (3), and I (1 0 10) of α-$Al_2O_3$ would be smaller than the calculated value of the equation (4). It is thus clear that the value of I (1 0 10) of α-$Al_2O_3$ determined by the equations (3) and (4) is conservative.

As a result of measurement on photomicrographs taken by a scanning-type electron microscope (S-2300 available from Hitachi, Ltd.), it has been found that the average crystal grain size of the α-aluminum oxide-based oxide layer of the present invention is 1 μm or less when the oxide layer thickness is 2.5 μm or less, 2 μm or less when the oxide layer thickness is more than 2.5 μm and 4.5 μm or less, and 3 μm or less when the oxide layer thickness is more than 4.5 μm. Incidentally, the thickness of the α-aluminum oxide layer is an average value of the thickness data taken at a plurality of spots on the SEM photomicrographs.

Though not necessarily clear, the reasons why the α-aluminum oxide-based oxide layer of the present invention has such a small average crystal grain size, and provides excellent mechanical properties and cutting properties to the coated tools may be presumed as follows:

As shown in FIG. 1 and Table 5 the equivalent X-ray diffraction peak ratio PR (1 0 10) is preferably 1.3 or more, more preferably 1.5 or more, and the (1 0 10) plane of α-$Al_2O_3$ is oriented in parallel with the substrate.

Figure 2A:
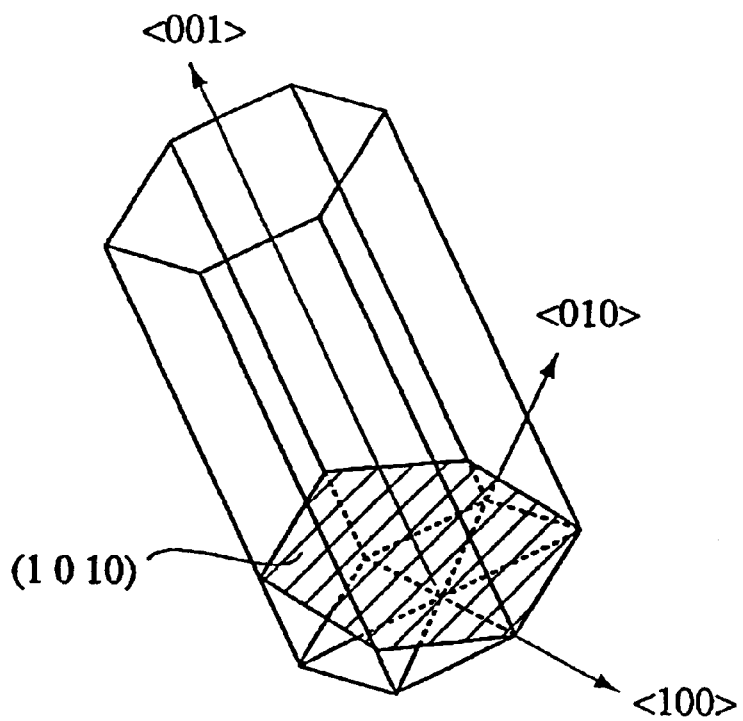
FIGS. 2(a) and 2(b) are schematic views showing the relations between a unit lattice and a crystal orientation in α-aluminum oxide.

As shown in FIGS. 2(a) and (b), the α-aluminum oxide crystal structure is constituted by hexagonal unit lattices having lattice constants of 0.476 nm in <100> and <010> axes and 1.299 nm in a <001> axis, the lattice constant in the <001> axes being about 3 times as long as those in the <100> and <010> axes. The (1 0 10) plane is hatched in FIG. 2(a), and the (012) plane and the (110) plane are hatched in FIG. 2(b).

Table 3 shows the maximum and minimum lengths of diagonals in the hatched planes in FIG. 2, which are determined from the above lattice constants of α-$Al_2O_3$. It is clear from Table 3 that in a unit lattice of α-$Al_2O_3$, the (1 0 10) plane is identical to the (012) plane in a minimum diagonal length, and the former is as small as 0.61 times the latter in a maximum diagonal length.

Figure 2B:
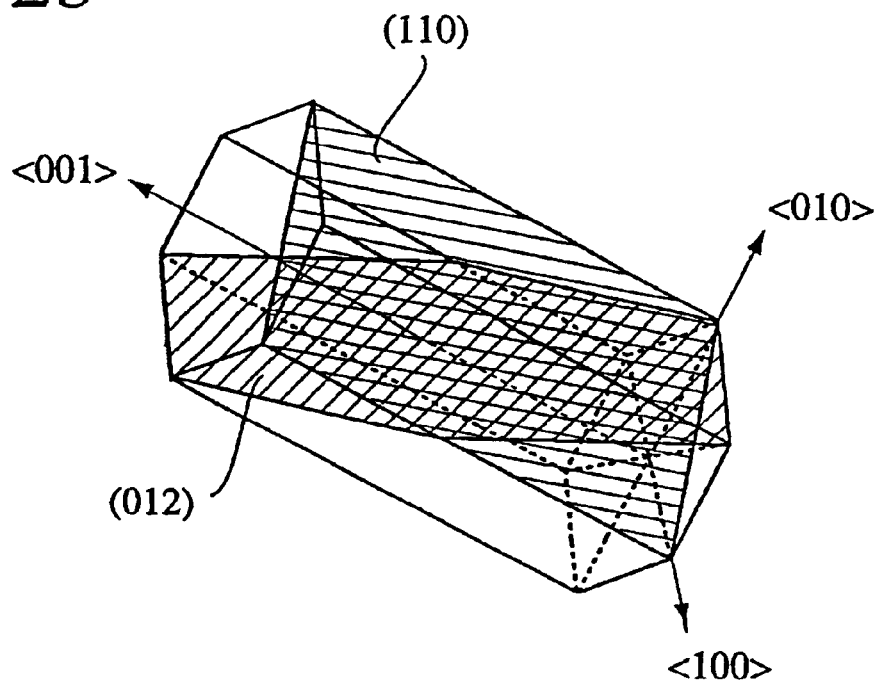

As shown in FIG. 2(a), when the (1 0 10) plane is in parallel with the substrate surface, the c axis of a unit lattice of α-$Al_2O_3$ is 72.3° close to vertical, to the substrate surface, suggesting that crystal grains elongated in the vertical direction are easily obtained. On the other hand, when the (012) plane is in parallel with the substrate surface as shown in FIG. 2(b), the c axis of a unit lattice of α-$Al_2O_3$ is only 32.3° to the substrate surface, suggesting that crystal grains elongated substantially along the substate surface are easily obtained.

As described above, it is considered that when the α-$Al_2O_3$ layer has a large PR (1 0 10), and when the (1 0 10)

plane of $\alpha$-$Al_2O_3$ is oriented substantially in parallel with the substrate surface, crystal grains are likely to become elongated substantially in vertical to the substrate surface, namely in a thickness direction of the aluminum oxide layer, thereby providing an $\alpha$-$Al_2O_3$ layer with smaller crystal grain sizes as compared with the oxide layer thickness.

TABLE 3

| Crystal Plane | (1010) | (012) | (110) | (1010)/(012) | (1010)/(110) |
|---|---|---|---|---|---|
| Minimum Diagonal Length (nm) | 0.952 | 0.952 | 1.538 | 1.00 | 0.62 |
| Maximum Diagonal Length (nm) | 0.986 | 1.610 | 1.538 | 0.61 | 0.64 |

For the above reasons, it may be considered that because the $\alpha$-$Al_2O_3$ layer of the present invention has a (1 0 10) plane oriented in parallel with the substrate surface, the $\alpha$-aluminum oxide layer has an average crystal grain size of 1 $\mu$m or less when the oxide layer thickness is 2.5 $\mu$m or less, 2 $\mu$m or less when the oxide layer thickness is more than 2.5 $\mu$m and 4.5 $\mu$m or less, and 3 $\mu$m or less when the oxide layer thickness is more than 4.5 $\mu$m. As the crystal grain size becomes small, an average surface roughness Ra and a maximum surface roughness $R_{max}$ of the $\alpha$-aluminum oxide layer along a centerline thereof become small. As a result, when it is used as a cutting tool, friction with a body to be cut is small, resulting in less wear of the coating layer and less peeling of crystal grains from the coating layer, which leads to better mechanical properties and durability.

In the coated tool of the present invention, the $\alpha$-aluminum oxide-based oxide layer should not necessarily be an outermost layer, and one or more layers of titanium compounds such as TiN may be formed on the $\alpha$-aluminum oxide-based oxide layer. In this case, the average crystal grain size of the $\alpha$-aluminum oxide-based oxide layer is measured after removing the titanium compound layer by a chemical etching method using a HF—$HNO_3$ aqueous solution, etc.

The $\alpha$-aluminum oxide-coated article of the present invention can be produced under the following conditions.

The first coating layer may be formed on a surface of the substrate by depositing at least one selected from the group consisting of carbides, nitrides, carbonitrides, oxides, oxycarbides, oxynitrides and oxycarbonitrides of metals in Groups IVa, Va and VIa of the Periodic Table preferably at 950 to 1020° C. for 5 to 60 minutes by a film-forming method such as a chemical vapor deposition (CVD), a plasma-assisted chemical vapor deposition (PACVD), etc. To ensure excellent adhesion to an $\alpha$-aluminum oxide layer, an outermost layer of the first coating layer is preferably made of at least one of oxides, oxycaxbides, oxynitrides and oxycarbonitrides of the above metals. A typical example of such an outermost layer is TiCO. The TiCO layer is preferably formed using a reaction gas mixture comprising a $TiCl_4$ gas, a $CH_4$ gas, a $H_2$ gas and a mixed oxidizing gas consisting of $CO_2$ and CO under the above-described conditions. A volume ratio of $CH_4/TiCl_4$ is preferably 4–10a volume ratio of ($CO_2$+CO)/$TiCl_4$ is preferably 0.2–10, and a volume ratio of CO/($CO_2$+CO) is preferably 0.1–0.98. It may be presumed that the existence of CO in the reaction gas mixture serves to make it easier to control the amount of oxygen contained in the resultant TiCO layer, thereby improving its adhesion to the overlying $\alpha$-aluminum oxide-based oxide layer.

The second coating layer comprising an $\alpha$-aluminum oxide-based oxide layer is deposited on the above outermost layer of the first coating layer, using a reaction gas mixture comprising an $AlCl_3$ gas and a mixed oxygen atom-containing gas consisting of $CO_2$ and CO in addition to a $H_2$ carrier gas. A volume ratio of ($CO_2$+CO) to the $AlCl_3$ gas is preferably 2–15, and a volume ratio of CO to ($CO_2$+CO) is preferably 0.5 to 0.95 more preferably 0.6 to 0.9. When the volume ratio of CO to ($CO_2$+CO) is less than 0.5, the aluminum oxide layer tends to be oriented in the (110) direction. On the other hand, when the volume ratio of CO to ($CO_2$+CO) is more than 0.95, the deposition rate of $Al_2O_3$ decreases rapidly, resulting in poor efficiency in the formation of the $\alpha$-aluminum oxide-based oxide layer. Using the above reaction gas composition, the resultant $\alpha$-aluminum oxide-based oxide layer has (1 0 10) orientation and a sufficiently small average crystal grain size.

The chemical vapor deposition or plasma-assisted chemical vapor deposition may be used in the formation of the $\alpha$-aluminum oxide-based oxide layer.

The articles on which the single- or multi-layer coatings ate formed according to the present invention are not restricted to cutting tools but may be such articles as various wear-resistant bodies, molding dies, forming dies, die-casting pins, metal melt-contacting members, etc.

The aluminum oxide is not restricted to $\alpha$-aluminum oxide only, but may be a mixture of $\alpha$-aluminum oxide with other aluminum oxides such as $\kappa$-aluminum oxide, $\gamma$-aluminum oxide, $\theta$-aluminum oxide, $\delta$-aluminum oxide, $\chi$-aluminum oxide, etc., or a mixture of $\alpha$-aluminum oxide with other oxides such as zirconium oxide, etc., as long as a major component of the aluminum oxide layer is $\alpha$-aluminum oxide. Thus, the term "$\alpha$-aluminum oxide-based oxide layer" used herein means an oxide layer based on $\alpha$-aluminum oxide, 60% or more of the total of X-ray diffraction peaks being derived from those of $\alpha$-aluminum oxide.

The present invention will be described in detail referring to EXAMPLES below, without intention of restricting the scope of the present invention thereto.

EXAMPLE 1

A cemented carbide substrate for a cutting tool having a composition of 72 weight % of WC, 8 weight % of TiC, 11 weight % of (Ta, Nb) C, and 9 weight % of Co was set in a CVD furnace to coat the cemented carbide substrate with a TiN layer having a thickness of 0.3 $\mu$m, by a chemical vapor deposition method at 900° C. using a $TiC_4$ gas, an $N_2$ gas and an $H_2$ carrier gas, and then with a 6-$\mu$m-thick TiCN layer at 900° C. using an $H_2$ carrier gas, a $TiCl_4$ gas and a $CH_3CN$ gas. Further, a TiC layer of about 0.05–2 $\mu$m in thickness was formed on the TiCN layer by supplying an $H_2$ carrier gas, a TiCl gas and a $CH_4$ gas to the CVD furnace at 950–1,200° C. at a flow rate of 2,200 ml/minute for 5–120 minutes, and then a TiCO layer of about 0.05–0.5 $\mu$m in thickness was formed on the TiC layer for 5–30 minutes by using the above reaction gas stream to which a mixed gas of $CO_2$ and CO was added at 2.2–110 ml/minute.

310 ml/minute of an $H_2$ gas and 130 ml/minute of an HCl gas were caused to pass through a small tube filled with aluminum pieces at 350° C., to generate an $AlCl_3$ gas, which was supplied to the CVD furnace together with 2 liter/minute of an $H_2$ gas, 50 ml/minute of a $CO_2$ gas and 350 ml/minute of a CO gas to form an aluminum oxide layer on the TiCO layer at 1000–1050° C.

The X-ray diffraction of the resultant multi-layer coating was measured by a 2$\theta$-$\theta$ method at 2$\theta$ of 10°–90° using an X-ray diffraction analyzer (RU-300R, available from Rigaku Denki, K. K.). Only a K$\alpha$1 ray of Cu (wavelength $\lambda$=0.154 nm) was used as an X-ray source, and Kα2 ray and noises were removed.

FIG. 1 shows an X-ray diffraction pattern of Sample No. 14. It is clear from FIG. 1 that the peak at 2θ of 76.9° in the X-ray diffraction pattern was strong in the coated article of the present invention. Table 4 shows the measured values of X-ray diffraction intensity of Sample Nos. 11–16 of the present invention produced in EXAMPLE 1, and Table 5 shows the equivalent X-ray diffraction peak ratios PR (hkl) determined from the measured values in Table 4. Table 6 shows PR (1 0 10), layer thickness, average crystal grain size and cutting test results (maximum continuous cutting time and maximum number of integument cutting) with respect to each sample. Here, the maximum continuous cutting time means the longest time period during which the coated tool can be used for continuous cutting operation without causing any trouble such as chipping, and the maximum number of intermittent cutting means the maximum number of intermittent cutting operation by which the coated tool can be used without causing any trouble such as chipping.

In Tables 4–6,α (hkl) shows (hkl) of α-Al$_2$O$_3$. It is clear from Tables 4–6 that PR (1 0 10) of α-Al$_2$O$_3$ in each sample was 1.3 or more, preferably 1.5 or more, and the maximum among the PR (hkl), and that therefore, the average crystal grain size was 1 μm or less when the oxide layer thickness was 2.5 μm or less, 2 μm or less when the oxide layer thickness was more than 2.5 μm and 4.5 μm or less, and 3 μm or less when the oxide layer thickness was more than 4.5 μm.

Figure 3A:
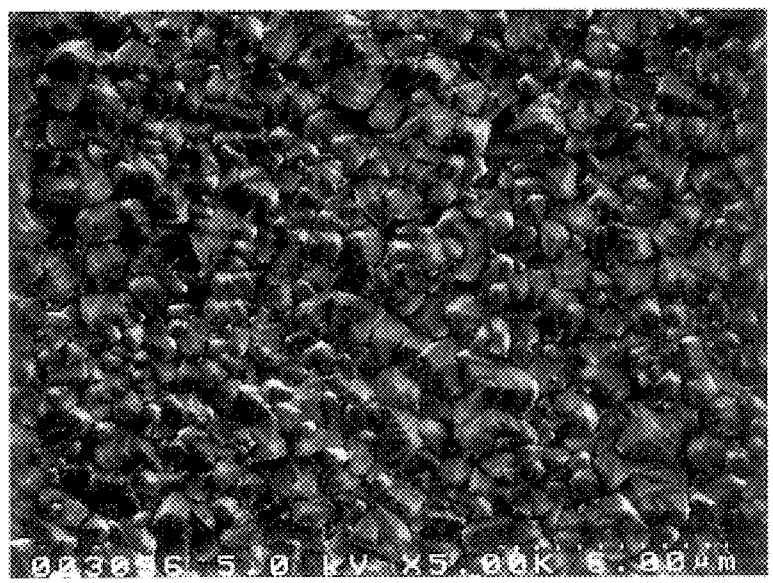
FIG. 3(a) is a SEM photomicrograph showing the surface texture of an α-aluminum oxide layer of the coated tool (Sample No. 14) in EXAMPLE 1.
Figure 3B:
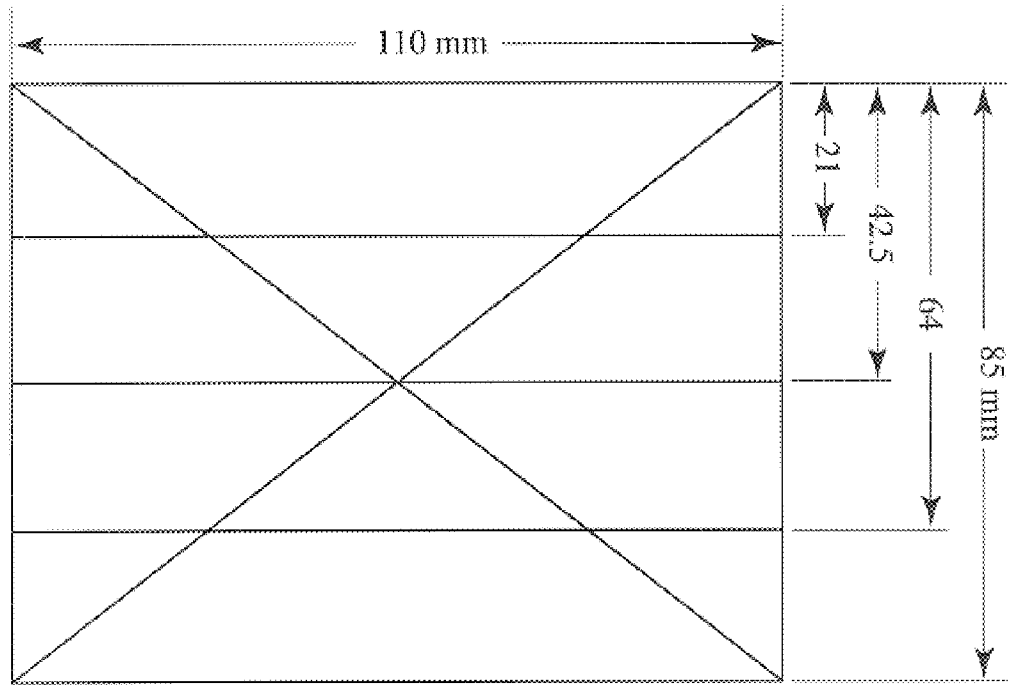
FIG. 3(b) is a schematic view corresponding to the SEM photomicrograph of FIG. 3(a) for showing a method of measuring an average crystal grain size.

The method of measuring an average crystal grain size will be explained using Sample No. 14. FIG. 3(a) shows a SEM photomicrograph (85 mm×110 mm, magnification: 4000) of an aluminum oxide layer surface of Sample No. 14. As shown in FIG. 3(b), three horizontal lines passing positions of 21 mm, 42.5 mm and 64 mm, respectively, from the top end of the SEM photomicrograph and two diagonal lines were drawn, and the number of crystal grain particles on each line was used to calculate the average crystal grain size by the following equation (5):

Average crystal grain size (μm)=[total length of lines (mm)/total number of crystal grain particles]×0.25      (5).

In the case of FIG. 3(a), the total length of lines was 606 mm, and the total number of crystal grain particles was 167. Thus, the average crystal grain size was 0.7 μm.

A surface of each sample polished at a slanting angle of 10° was observed by a laser microscope to measure distances between adjacent layer boundaries, thereby determining the thickness of each layer.

In the continuous cutting test of cast iron, cutting tools (five for each of Sample Nos. 11–16) produced in EXAMPLE 1 were used for 1 hour under the following conditions, and then the wear of a flank of each tool was observed by an optical microscope (magnification: 200). The cutting life was determined at a time when the depth of wear reached 0.2 mm.

Body to be cut: cast iron FC25 (HB230),

Shape of tool: CNMA 120412

Cutting speed: 300 m/minute,

Feed speed: 0.3 mm/revolution,

Depth of cutting: 2.0 mm, and

Cutting liquid: Aqueous solution.

Next, in the intermittent cutting test, cutting tools (five for each of Sample Nos. 11–16) as above were used under the following conditions until chipping took place, and then the maximum number of intermittent cutting was counted. The chipping of each coated tool was observed by an optical microscope (magnification: 50).

Body to be cut: Grooved body made of S53C (HS38),

Cutting speed: 220 m/minute,

Feed speed: 0.2 mm/revolution,

Depth of cutting: 2.0 mm, and

Cutting liquid: Non (dry cutting).

The cutting test results are shown in Table 6. It is clear from Table 6 that when PR (1 0 10) was 1.3 or more (Sample No. 12), the average crystal grain size was as small as 1.8 μm at an aluminum oxide layer thickness of 3.5 μm, showing good cutting properties (maximum continuous cutting time= 60 minutes, and maximum intermittent cutting number=1,000). Also, when PR (1 0 10) was 1.5 or more (Sample No. 13), the average crystal grain size was as small as 1.3 μm at a layer thickness of 3.5 μm, showing better cutting properties (maximum continuous cutting time=80 minutes, and maximum intermittent cutting number=1,300). Further, when PR (1 0 10) was 3.76 (Sample No. 14), the average crystal grain size was as small as 0.7 μm at a layer thickness of 3.5 μm, showing much better cutting properties (maximum continuous cutting time=90 minutes, and maximum intermittent cutting number=1,500).

It is clear from the cutting test results of the above samples and Sample Nos. 11, 15 and 16 that PR (1 0 10) is 1.3 or more in the coated tool of the present invention; that the average crystal grain size is 1 μm or less at the oxide layer thickness of 2.5 μm or less, 2 μm or less at the oxide layer thickness of more than 2.5 μm and 4.5 μm or less, and 1.7 μm or less at the oxide layer thickness is more than 4.5 μm and 6 μm or less; that the maximum continuous cutting time is 60 or more; and that the maximum number intermittent cutting is 1,000 or more.

COMPARATIVE EXAMPLE 1

To investigate the influence of PR (1 0 10) on the average crystal grain size of the α-aluminum oxide-based oxide layer and the cutting properties of the coated tool, a cemented carbide substrate for a cutting tool having a composition of 72 weight % of WC, 8 weight % of TiC, 11 weight % of (Ta, Nb) C, and 9 weight % of Co was coated with a TiN layer having a thickness of 0.3 μm and a TiCN layer having a thickness of 6 μm. Further, a TiC layer of about 0.05–2 μm in thickness was formed on the TiCN layer at 1010° C. for 5–120 minutes by using an H$_2$ carrier gas, a TiCl$_4$ gas and a CH$_4$ gas. After stopping the supply of the TiCl$_4$ gas and the CH$_4$ gas, an H$_2$ carrier gas and a CO$_2$ gas were supplied to oxidize the TiC layer at 1010° C. for 15 minutes. Thereafter, an H$_2$ gas, an AlCl$_3$ gas and a CO$_2$ gas were supplied at 1020° C. to form an aluminum oxide layer on the oxidized TiC layer (titanium oxides such as Ti$_2$O$_3$, Ti$_3$O$_5$, TiO$_2$, etc.) under the same conditions as in EXAMPLE 1.

The resultant coated tool was measured with respect to X-ray diffraction intensity, equivalent X-ray diffraction peak ratio PR (1 0 10), and average crystal grain size. The results are shown in Tables 4–6. It is clear from Table 6 that the cutting tool of COMPARATIVE EXAMPLE 1 had PR (1 0 10) of less than 1.3 and as large an average crystal grain size as 2.7 μm at an aluminum oxide layer thickness of 3.5 μm.

As a result of the same cutting tests as in EXAMPLE 1 using five cutting tools of COMPARATIVE EXAMPLE 1 it was found that the oxide layer was peeled after 30-minute continuous cutting operation, and that large chipping took place after 800 intermittent impact cutting operations, suggesting the poor characteristics of the cutting tools of

COMPARATIVE EXAMPLE 1.

TABLE 4

| α (hkl) | 2θ (°) | $I_0$ | I (hkl) | | | | | | |
|---|---|---|---|---|---|---|---|---|---|
| | | | No. 11 | No. 12 | No. 13 | No. 14 | No. 15 | No. 16 | No. 17* |
| α (012) | 25.58 | 75 | 1448 | 304 | 984 | 1359 | 270 | 417 | 3977 |
| α (104) | 35.13 | 90 | 3458 | 326 | 509 | 1282 | 260 | 859 | 795 |
| α (110) | 37.78 | 40 | 1545 | 1790 | 1530 | 870 | 1052 | 770 | 846 |
| α (113) | 43.36 | 100 | 2093 | 600 | 1028 | 934 | 555 | 805 | 047 |
| α (024) | 52.55 | 45 | 1233 | 282 | 812 | 1156 | 203 | 266 | 2091 |
| α (116) | 57.52 | 80 | 2943 | 276 | 841 | 1273 | 192 | 561 | 673 |
| α (124) | 66.54 | 30 | 640 | 264 | 260 | 387 | 177 | 180 | 316 |
| α (030) | 68.19 | 50 | 497 | 766 | 304 | 206 | 256 | 306 | 447 |
| α (1010) | 76.88 | 16 | 911 | 253 | 364 | 1402 | 870 | 4579 | 439 |
| 2θ = 76.9° | — | — | 1168 | 804 | 927 | 1675 | 1605 | 4821 | 592 |
| TiCN (111) | — | — | 1211 | 2594 | 2652 | 1287 | 3458 | 1139 | 721 |

Note
*COMPARATIVE EXAMPLE 1.

TABLE 5

| α (hkl) | PR (hkl) | | | | | | |
|---|---|---|---|---|---|---|---|
| | No. 11 | No. 12 | No. 13 | No. 14 | No. 15 | No. 16 | No. 17* |
| α (012) | 0.64 | 0.34 | 0.89 | 0.78 | 0.29 | 0.14 | 2.44 |
| α (104) | 1.28 | 0.30 | 0.38 | 0.61 | 0.23 | 0.24 | 0.41 |
| α (110) | 1.29 | 3.73 | 2.58 | 0.93 | 2.14 | 0.49 | 0.97 |
| α (113) | 0.70 | 0.50 | 0.69 | 0.40 | 0.45 | 0.20 | 0.48 |
| α (024) | 0.91 | 0.52 | 1.22 | 1.10 | 0.37 | 0.15 | 2.14 |
| α (116) | 1.23 | 0.29 | 0.71 | 0.68 | 0.20 | 0.18 | 0.39 |
| α (124) | 0.71 | 0.73 | 0.59 | 0.55 | 0.48 | 0.15 | 0.49 |
| α (030) | 0.33 | 1.28 | 0.41 | 0.18 | 0.42 | 0.16 | 0.41 |
| α (1010) | 1.90 | 1.32 | 1.53 | 3.76 | 4.42 | 7.28 | 1.26 |

Note
*COMPARATIVE EXAMPLE 1.

TABLE 6

| α-$Al_2O_3$ | No. 11 | No. 12 | No. 13 | No. 14 | No. 15 | No. 16 | No. 17* |
|---|---|---|---|---|---|---|---|
| PR (1010) | 1.90 | 1.32 | 1.53 | 3.76 | 4.42 | 7.28 | 1.26 |
| Thickness (μm) | 2.5 | 3.5 | 3.5 | 3.5 | 4.5 | 6.0 | 3.5 |
| Average Crystal Grain Size (μm) | 0.9 | 1.8 | 1.3 | 0.7 | 1.4 | 2.3 | 2.7 |
| Maximum Continuous Cutting Time (minute) | 60 | 60 | 80 | 90 | 100 | 100 | 30 |
| Maximum Number of Intermittent Cutting | 1,300 | 1,000 | 1,300 | 1,500 | 1,500 | 1,500 | 800 |

Note
*COMPARATIVE EXAMPLE 1.

EXAMPLE 2

After carrying out the same process as in EXAMPLE 1 until the formation of an aluminum oxide layer, 4 liter/minute of an $H_2$ carrier gas, 50 ml/minute of a $TiCl_4$ gas, and 1.3 liter minute of a $N_2$ gas were supplied for 20 minutes to form a titanium nitride layer on the aluminum oxide layer at 1020° C. The resultant coated tools were measured with respect to X-ray diffraction intensity, equivalent X-ray diffraction peak ratio PR (hkl), PR (1 0 10), layer thickness, average crystal grain size and cutting properties (maximum continuous cutting time and maximum intermittent cutting number). The measured values of these properties are shown in Tables 7–9.

Figure 4:
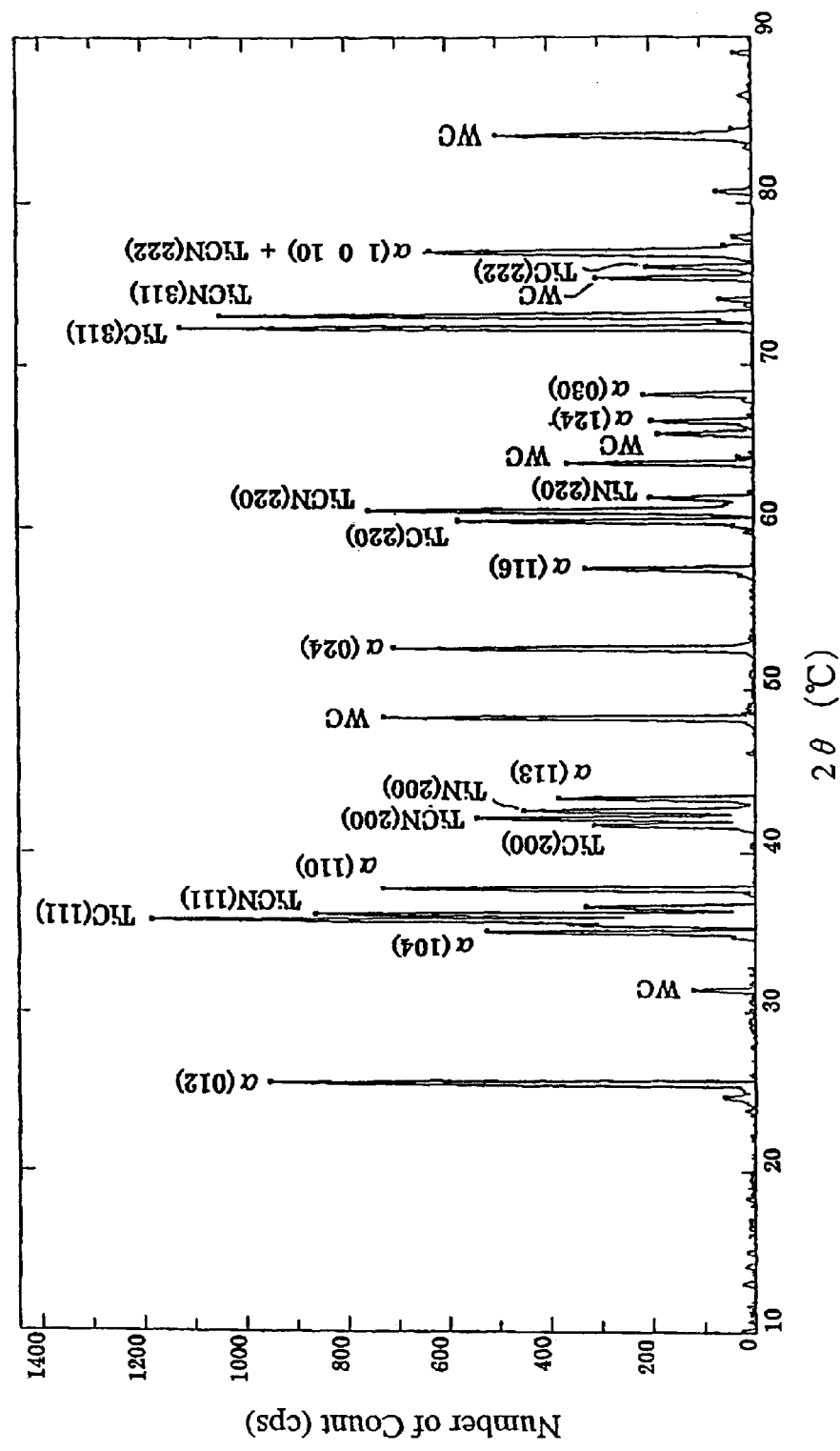
FIG. 4 is a graph showing an X-ray diffraction pattern of the aluminum oxide-coated tool (Sample No. 24) in EXAMPLE 2.

FIG. 4 shows an X-ray diffraction pattern of Sample No. 24 obtained in EXAMPLE 2 which is a typical X-ray diffraction pattern of the coated tool of the present invention.

The average crystal grain size of the α-aluminum oxide-based oxide layer was measured in the same manner as in EXAMPLE 1 after removing the TiN layer by a HF—$HNO_3$ aqueous solution, etc.

It is clear from Table 9 that the α-$Al_2O_3$ layer of EXAMPLE 2 showed PR (1 0 10) of 1.3 or more, preferably 1.5 or more, and the maximum among the PR (hkl), and that the average crystal grain size was 1 μm or less at an aluminum oxide layer thickness of 2.5 μm or less, 2 μm or less at an aluminum oxide layer thickness of more than 2.5 μm and 4.5 μm or less, and 3 μm or less at an aluminum oxide layer thickness of more than 4.5 μm.

It was also found from Table 9 that when PR (1 0 10) was 1.3 or more (Sample No. 24), the average crystal grain size was as small as 3.0 μm at an aluminum oxide layer thickness of 6 μm, showing better cutting properties (maximum continuous cutting time=130 minutes, and maximum intermittent cutting number=1,800). Further, when PR (1 0 10) was 1.5 or more (Sample No. 25), the average crystal grain size was as small as 2.5 μm at an aluminum oxide layer thickness of 6 μm, showing much better cutting properties (maximum continuous cutting time=150 minutes, and maximum intermittent cutting number=2,000). It has been confirmed from these data that PR (1 0 10) is more preferably 1.5 or more, and that the average crystal grain size is preferably 2.5 μm or less when the oxide layer thickness exceeds 6.0 μm.

Sample No. 22 showed PR (1 0 10) of 1.71 and an average crystal grain size of 2.0 μm at an aluminum oxide layer thickness of 4.5 μm, excellent in cutting properties (maximum continuous cutting time=100 minutes, and maximum intermittent cutting number=1,500). Further, Sample No. 23 showed PR (1 0 10) of 3.69, and an average crystal grain size of as small as 1.5 μm at an aluminum oxide layer thickness of 4.5 μm, excellent in cutting properties (maximum continuous cutting time=130 minutes, and maximum intermittent cutting number=1,800). It is confirmed that the average crystal grain size is preferably 1.5 μm or less at a layer thickness of 4.5 μm.

COMPARATIVE EXAMPLE 2

To investigate the influence of PR (1 0 10) on the average crystal grain size of the α-aluminum oxide-based oxide layer and the cutting properties of the coated tool, EXAMPLE 2 was repeated until the formation of the TiC layer. Next, after stopping the supply of the TiCl$_4$ gas and the CH$_4$ gas, an H$_2$ carrier gas and a CO$_2$ gas were supplied to oxidize the TiC layer at 1010° C. for 15 minutes. Thereafter, an H$_2$ gas, an AlCl$_3$ gas and a CO$_2$ gas were supplied at 1020° C. to form an aluminum oxide layer on the oxidized TiC (titanium oxide) layer under the same conditions as in EXAMPLE 2. Further, 4 liter/minute of an H$_2$ gas, 50 ml/minute of a TiCl$_4$ gas and 1.3 liter/minute of an N$_2$ gas were supplied at 1020° C. for 20 minutes to form a titanium nitride layer on the aluminum oxide layer.

The resultant coated tool was measured with respect to equivalent X-ray diffraction peak ratio PR (1 0 10), layer thickness and average crystal grain size. The results are shown in Table 9. It is clear from Table 9 that the cutting tool of COMPARATIVE EXAMPLE 2 had PR (1 0 10) of less than 1.3 and as large an average crystal grain size as 3.5 μm at an aluminum oxide layer thickness of 6 μm.

As a result of the same cutting tests as in EXAMPLE 2 using five cutting tools of COMPARATIVE EXAMPLE 2 it was found that the oxide layer was peeled after 40-minute continuous cutting operation, and that large chipping took place after 600 intermittent impact cutting operations, suggesting the poor characteristics of the cutting tools of COMPARATIVE EXAMPLE 2.

TABLE 7

| α (hkl) | 2θ (°) | I$_0$ | PR (hkl) | | | | | | |
|---|---|---|---|---|---|---|---|---|---|
| | | | No. 21 | No. 22 | No. 23 | No. 24 | No. 25 | No. 26 | No. 27* |
| α (012) | 25.58 | 75 | 1722 | 286 | 3130 | 956 | 2684 | 523 | 4908 |
| α (104) | 35.13 | 90 | 5522 | 1963 | 278 | 520 | 1539 | 347 | 3277 |
| α (110) | 37.78 | 40 | 484 | 310 | 794 | 731 | 1107 | 571 | 718 |
| α (113) | 43.36 | 100 | 1355 | 484 | 115 | 368 | 682 | 294 | 3256 |
| α (024) | 52.55 | 45 | 1168 | 349 | 1683 | 710 | 2085 | 514 | 2607 |
| α (116) | 57.52 | 80 | 3481 | 2769 | 314 | 329 | 997 | 333 | 698 |
| α (124) | 66.54 | 30 | 390 | 204 | 0 | 199 | 0 | 158 | 203 |
| α (030) | 68.19 | 50 | 335 | 1327 | 0 | 220 | 0 | 0 | 0 |
| α (1010) | 76.88 | 16 | 1813 | 429 | 1192 | 204 | 466 | 680 | 573 |
| 2θ = 76.9° | — | — | 2197 | 529 | 1281 | 387 | 683 | 941 | 957 |
| TiCN (111) | — | — | 1806 | 473 | 419 | 859 | 1019 | 1226 | 1806 |

Note
COMPARATIVE EXAMPLE 2.

TABLE 8

| α (hkl) | PR (hkl) | | | | | | |
|---|---|---|---|---|---|---|---|
| | No. 21 | No. 22 | No. 23 | No. 24 | No. 25 | No. 26 | No. 27* |
| α (012) | 0.66 | 0.24 | 2.07 | 1.36 | 1.84 | 0.69 | 2.25 |
| α (104) | 1.77 | 1.40 | 0.15 | 0.62 | 0.88 | 0.38 | 1.25 |

TABLE 8-continued

| α (hkl) | PR (hkl) | | | | | | |
|---|---|---|---|---|---|---|---|
| | No. 21 | No. 22 | No. 23 | No. 24 | No. 25 | No. 26 | No. 27* |
| α (110) | 0.35 | 0.50 | 0.98 | 1.95 | 1.42 | 1.41 | 0.62 |
| α (113) | 0.39 | 0.31 | 0.06 | 0.39 | 0.35 | 0.29 | 1.12 |
| α (024) | 0.75 | 0.50 | 1.85 | 1.69 | 2.38 | 1.12 | 1.99 |
| α (116) | 1.25 | 2.21 | 0.19 | 0.44 | 0.64 | 0.41 | 0.30 |
| α (124) | 0.37 | 0.43 | 0.00 | 0.71 | 0.00 | 0.52 | 0.23 |
| α (030) | 0.19 | 1.70 | 0.00 | 0.47 | 0.00 | 0.00 | 0.00 |
| α (1010) | 3.26 | 1.71 | 3.69 | 1.37 | 1.50 | 4.19 | 1.23 |

Note
*COMPARATIVE EXAMPLE 2.

TABLE 9

| α-Al$_2$O$_3$ | No. 21 | No. 22 | No. 23 | No. 24 | No. 25 | No. 26 | No. 27* |
|---|---|---|---|---|---|---|---|
| PR (1010) | 3.26 | 1.71 | 3.69 | 1.37 | 1.50 | 4.19 | 1.23 |
| Thickness (μm) | 2.5 | 4.5 | 4.5 | 6.0 | 6.0 | 7.0 | 6.0 |
| Average Crystal Grain Size (μm) | 1.0 | 2.0 | 1.5 | 3.0 | 2.5 | 2.0 | 3.5 |
| Maximum Time Period of Continuous Cutting (minute) | 80 | 100 | 130 | 130 | 150 | 170 | 40 |
| Maximum Number of Intermittent Cutting | 1,300 | 1,500 | 1,800 | 1,800 | 2,000 | 2,200 | 600 |

Note
*COMPARATIVE EXAMPLE 2.

As described above because the aluminium oxide-coated article of the present invention has a single- or multi-layer coating made of at least one selected from the group consisting of carbides, nitrides, carbonitrides, oxides, oxycarbides, oxynitrides and oxycaibonitrides of metals in Groups IVa, Va and VIa of the Periodic Table, and an α-aluminum oxide-based oxide layer having an equivalent X-ray diffraction peak ratio PR (1 0 10) of 1.3 or more or maximum the α-aluminum oxide layer has a small average crystal grain size, resulting in excellent cutting properties.

What is claimed is:

1. An aluminum oxide-coated article having a first coating layer and a second coating layer formed in this order on a substrate, said first coating layer having a single- or a multi-layer structure and being made of at least one member selected from the group consisting of carbides, nitrides, carbonitrides, oxides, oxycarbides, oxynitrides and oxycarbonitrides of metals in Groups IVa, Va and VIa of the Periodic Table, and said second coating layer being constituted by at least one α-aluminum oxide-based oxide layer, which has an equivalent X-ray diffraction peak ratio PR (1 0 10) of 1.3 or more in a (1 0 10) plane, wherein a surface of said α-aluminum oxide-based oxide layer has an average crystal grain size of 1 μm or less when the oxide layer thickness is 2.5 μm or less, an average grain size of 2 μm or less when the oxide layer thickness is more than 2.5 μm and 4.5 μm or less, and an average grain size of 3 μm or less when the oxide layer thickness is more than 4.5 μm.

2. The aluminum oxide-coated article according to claim 1, wherein the equivalent X-ray diffraction peak ratio PR (1 0 10) of said α-aluminum oxide-based oxide layer is the maximum in a (1 0 10) plane.

3. The aluminum oxide-coated article according to claim 2, wherein said α-aluminium oxide-based oxide layer is coated with a titanium compound layer.

4. The aluminum oxide-coated article according to claim 2, wherein said substrate is made of a cemented carbide composed of at least one member selected from the group consisting of carbides, nitrides and carbonitrides of metals in Groups IVa, Va and VIa of the Periodic Table and at least one metal selected from the group consisting of Fe, Ni, Co, W, Mo and Cr.

5. The aluminum oxide-coated article according to claim 2, wherein said article is a tool.

6. The aluminum oxide-coated article according to claim 1, wherein said α-aluminum oxide-based oxide layer is coated with a titanium compound layer.

7. The aluminum oxide-coated article according to claim 1, wherein said substrate is made of a cemented carbide composed of at least one selected from the group consisting of carbides, nitrides and carbonitrides of metals in Groups IVa, Va and VIa of the Periodic Table and at least one metal selected from the group consisting of Fe, Ni, Co, W, Mo and Cr.

8. The aluminum oxide-coated article according to claim 1, wherein said article is a tool.

9. The aluminum oxide-coated article according to claim 1, wherein said crystal grains are elongated in a direction vertical to the substrate surface, which is in a thickness direction of the aluminum oxide layer.

10. The aluminum oxide-coated article according to claim 9, wherein said α-aluminum oxide-based oxide layer is coated with a titanium compound layer.

11. The aluminum oxide-coated article according to claim 9, wherein said substrate is made of a cemented carbide composed of at least one member selected from the group consisting of carbides, nitrides and carbonitrides of metals in Groups IVa, Va and VIa of the Periodic Table and at least one metal selected from the group consisting of Fe, Ni, Co, W, Mo and Cr.

12. The aluminum oxide-coated article according to claim 9, wherein said article is a tool.

* * * * *